US 8,809,864 B2

(12) United States Patent
Sung et al.

(10) Patent No.: US 8,809,864 B2
(45) Date of Patent: Aug. 19, 2014

(54) LIQUID CRYSTAL DISPLAY AND METHOD FOR MANUFACTURING THE SAME

(75) Inventors: Woo Yong Sung, Seoul (KR); Tae Woon Cha, Seoul (KR); Jeong Ho Lee, Seoul (KR); Sang Gun Choi, Suwon-si (KR); Hyoung Wook Lee, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 88 days.

(21) Appl. No.: 13/361,614

(22) Filed: Jan. 30, 2012

(65) Prior Publication Data

US 2012/0326172 A1 Dec. 27, 2012

(30) Foreign Application Priority Data

Jun. 27, 2011 (KR) .................. 10-2011-0062436

(51) Int. Cl.
*H01L 33/00* (2010.01)
(52) U.S. Cl.
USPC .............. 257/59; 428/690; 428/426; 428/689
(58) Field of Classification Search
CPC ....................................................... H01L 33/00
USPC ............. 257/59, E33.063, E21.502, E29.003, 257/E21.7; 438/30, 155; 428/690, 426, 689, 428/469; 349/43, 119, 118, 120, 126, 73, 349/78, 67, 68
See application file for complete search history.

(56) References Cited

U.S. PATENT DOCUMENTS

| 5,589,963 | A | * | 12/1996 | Gunning et al. | .............. | 349/119 |
| 2004/0046902 | A1 | * | 3/2004 | Yamasaki | ....................... | 349/43 |
| 2004/0081852 | A1 | * | 4/2004 | Chen et al. | .................... | 428/690 |
| 2008/0309698 | A1 | | 12/2008 | Nakano et al. | | |
| 2008/0316405 | A1 | * | 12/2008 | Jung et al. | ..................... | 349/123 |
| 2009/0092761 | A1 | | 4/2009 | Ishida | | |
| 2009/0302745 | A1 | * | 12/2009 | Otsu et al. | ...................... | 313/504 |
| 2009/0315031 | A1 | * | 12/2009 | Kim et al. | ........................ | 257/59 |
| 2010/0059752 | A1 | * | 3/2010 | Lee et al. | ........................ | 257/59 |

FOREIGN PATENT DOCUMENTS

| JP | 2004-255316 | 9/2004 |
| JP | 2005-292685 | 10/2005 |
| JP | 2006-007079 | 1/2006 |
| JP | 2009-142736 | 7/2009 |
| JP | 2010-181674 | 8/2010 |
| KR | 10-2006-0064825 | 6/2006 |
| KR | 10-0704257 | 3/2007 |
| KR | 10-2007-0075783 | 7/2007 |
| KR | 10-2009-0072871 | 7/2009 |

* cited by examiner

*Primary Examiner* — David Vu
*Assistant Examiner* — Mouloucoulaye Inoussa
(74) *Attorney, Agent, or Firm* — H.C. Park & Associates, PLC

(57) ABSTRACT

Provided is a liquid crystal display including: a first substrate; a thin film transistor disposed on the first substrate; a passivation layer disposed on the thin film transistor and comprising a contact hole exposing an electrode of the thin film transistor; a pixel electrode disposed on the passivation layer and connected to the electrode of the thin film transistor through the contact hole; a lower buffer layer disposed on the pixel electrode; a lower alignment layer disposed on the lower buffer layer; a second substrate facing the first substrate; a common electrode disposed on the second substrate; an upper buffer layer disposed on the common electrode; and an upper alignment layer disposed on the upper buffer layer, in which the lower buffer layer comprises parylene, the upper buffer layer comprises parylene, or both the lower and the upper buffer layers comprise parylene.

11 Claims, 4 Drawing Sheets

LIQUID CRYSTAL DISPLAY AND METHOD FOR MANUFACTURING THE SAME

CROSS-REFERENCE TO RELATED APPLICATION

This application claims priority from and the benefit of Korean Patent Application No. 10-2011-0062436 filed in the Korean Intellectual Property Office on Jun. 27, 2011, which is incorporated herein by reference for all purposes as if fully set forth herein.

BACKGROUND OF THE INVENTION

1. Field of the Invention

The present invention relates to a liquid crystal display and manufacturing method thereof.

2. Discussion of the Background

Liquid crystal displays (LCDs) are one of the most widely used types of flat panel displays. An LCD has two substrates on which electrodes are disposed, and a liquid crystal layer is disposed between the substrates. The LCD adjusts the amount of transmitted light by applying signals to the electrodes to realign liquid crystal molecules in the liquid crystal layer.

The liquid crystal display includes a thin film transistor array panel and a common electrode panel which face each other, and a liquid crystal layer disposed between the thin film transistor array panel and the common electrode panel.

Alignment layers may be disposed on display areas of the thin film transistor array panel and the common electrode panel so as to align liquid crystal molecules of the liquid crystal layer. The alignment layer may be formed by an inkjet method which is applicable to larger-sized liquid crystal display panels.

An alignment layer dripping by the ink jet method spreads by itself but the alignment layer is not formed due to a step at a contact hole, which leaves a stain.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a liquid crystal display having an advantage of reducing display defects by allowing an alignment layer to be disposed on a contact hole and a periphery of the contact hole.

Additional features of the invention will be set forth in the description which follows, and in part will be apparent from the description, or may be learned by practice of the invention.

An exemplary embodiment of the present invention provides a liquid crystal display including: a first substrate; a thin film transistor disposed on the first substrate; a passivation layer disposed on the thin film transistor and comprising a contact hole exposing an electrode of the thin film transistor; a pixel electrode disposed on the passivation layer and connected to the electrode of the thin film transistor through the contact hole; a lower buffer layer disposed on the pixel electrode; a lower alignment layer disposed on the lower buffer layer; a second substrate facing the first substrate; a common electrode disposed on the second substrate; an upper buffer layer disposed on the common electrode; and an upper alignment layer disposed on the upper buffer layer, wherein the lower buffer layer comprises parylene, the upper buffer layer comprises parylene, or both the lower and the upper buffer layers comprise parylene.

Another exemplary embodiment of the present invention provides a method for manufacturing a liquid crystal display, including: forming a thin film transistor on a first substrate; forming a passivation layer on the thin film transistor with a contact hole exposing an electrode of the thin film transistor; forming a pixel electrode on the passivation layer, the pixel electrode being connected to the electrode of the thin film transistor through the contact hole; forming a lower buffer layer on the pixel electrode; forming a lower alignment layer on the lower buffer layer; forming a common electrode on a second substrate; forming an upper buffer layer on the common electrode; forming an upper alignment layer on the upper buffer layer; and coupling the second substrate with the first substrate to face them each other with a liquid crystal layer being interposed therebetween, wherein the lower buffer layer comprises parylene, the upper buffer layer comprises parylene, or both the lower buffer layer and the upper buffer layers comprise parylene.

According to the exemplary embodiments of the present invention, since the alignment layer is formed on the buffer layer, the spreading of the alignment layer may be improved, thereby allowing the alignment layer to be disposed on the contact hole.

In addition, the buffer layer may reduce a residual gas of the color filter permeating the liquid crystal layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
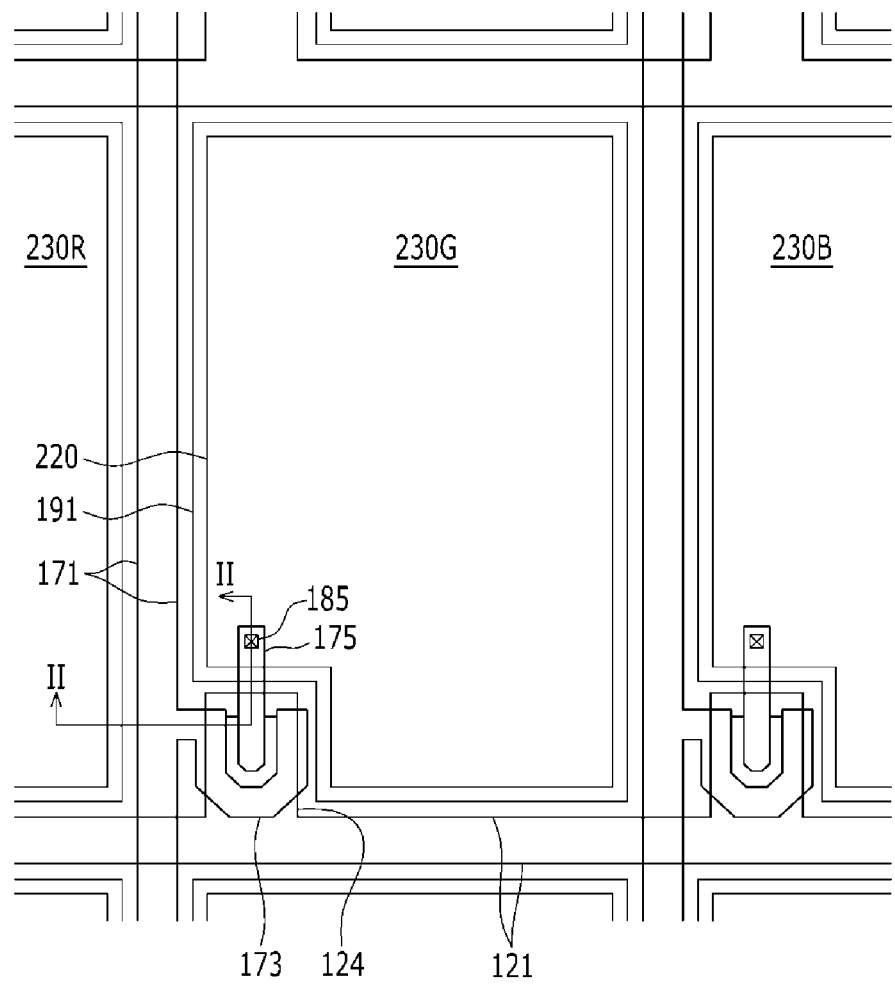
FIG. 1 is a plan view of a liquid crystal display according to an exemplary embodiment of the present invention.

The present invention will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art.

In the drawings, the thickness of layers, films, panels, regions, etc., are exaggerated for clarity. Like reference numerals designate like elements throughout the specification. It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
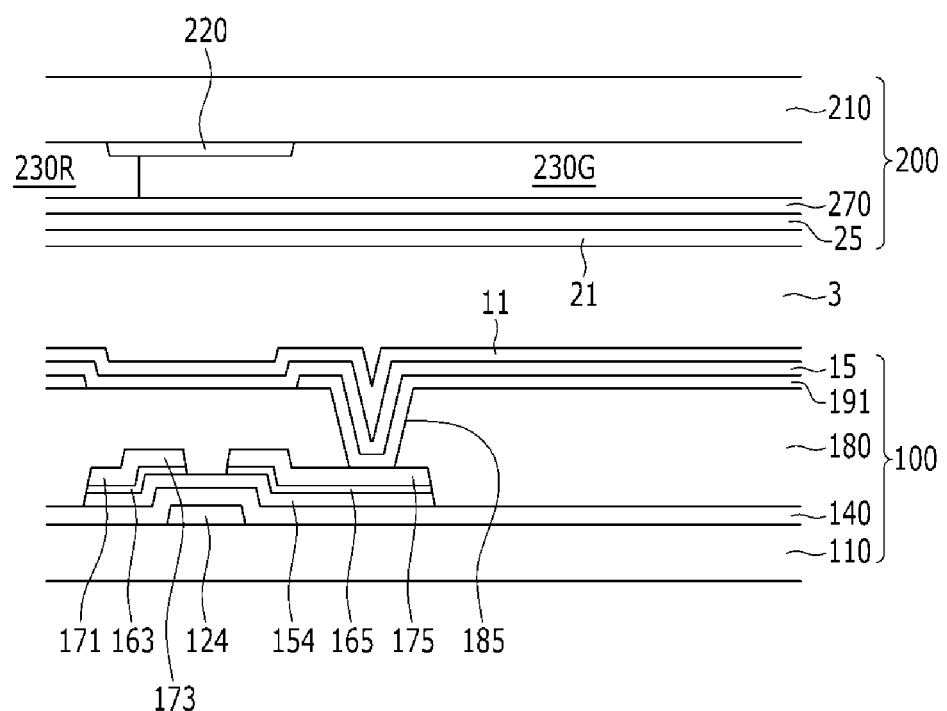
FIG. 2 is a cross-sectional view of the liquid crystal display taken along line II-II of FIG. 1.

FIG. 1 is a plan view of a liquid crystal display according to an exemplary embodiment of the present invention, and FIG. 2 is a cross-sectional view of the liquid crystal display taken along line II-II of FIG. 1.

As shown in FIGS. 1 and 2, a liquid crystal display according to an exemplary embodiment of the present invention may include a thin film transistor array panel 100, a common electrode panel 200 facing the thin film transistor array panel 100, and a liquid crystal layer 3 interposed between the two panels 100 and 200.

First, the thin film transistor array panel 100 will be described with reference to FIGS. 1 and 2.

A plurality of gate lines 121 may be disposed on a first substrate 110 which may comprise an insulating material such as glass or plastic. On the first substrate 110 and the gate lines 121, a gate insulating layer 140, a plurality of semiconductor islands 154, a plurality of ohmic contacts 163 and 165, a plurality of data lines 171 and a plurality of drain electrodes 175 may be disposed in sequence.

The gate line 121 transmits a gate signal and may generally extend in a horizontal direction. The gate lines 121 each may include a plurality of gate electrodes 124, which protrude upwards.

The data line 171 transmits a data signal and may generally extend in a vertical direction to cross the gate line 121. The data lines 171 each may include a plurality of source electrodes 173 which may extend toward the gate electrodes 124. The drain electrodes 175 may be separated from the data lines 171 and face the source electrodes 173 with respect to the gate electrodes 124.

The semiconductor islands 154 may be disposed on the gate electrodes 124, and ohmic contacts 163 and 165 on the semiconductor islands 154 may be disposed between the semiconductor island 154 and the data line 171 and between the semiconductor island 154 and the drain electrode 175 to reduce contact resistance therebetween.

A gate electrode 124, a source electrode 173 and a drain electrode 175 may comprise a thin film transistor (TFT) together with the semiconductor island 154 and a channel of the thin film transistor may be formed in the semiconductor islands 154 between the source electrode 173 and the drain electrode 175.

A passivation layer 180 may be disposed on the gate insulating layer 140, the data line 171 and the drain electrode 175. A contact hole 185 to expose the drain electrode 175 may be formed in the passivation layer 180.

A pixel electrode 191 may be disposed on the passivation layer 180. The pixel electrode 191 may comprise a transparent conductive material such as indium tin oxide (ITO) or indium zinc oxide (IZO) or a reflective metal such as aluminum or an alloy of silver. The pixel electrode 191 is connected to the drain electrode 175 through the contact hole 185.

A lower buffer layer 15 may be disposed on the pixel electrode 191 and a lower alignment layer 11 may be disposed on the lower buffer layer 15.

Hereinafter, a common electrode panel 200 will be described with reference to FIGS. 1 and 2.

A light blocking member 220 may be disposed on the second substrate 210 which may comprise an insulating material such as glass or plastic and color filters 230R, 230G, and 230B may be disposed on the light blocking member 220.

A common electrode 270 may be disposed on the light blocking member 220 and the color filters 230R, 230G, and 230B, and an upper buffer layer 25 may be disposed on the common electrode 270. An upper alignment layer 21 may then be disposed on the upper buffer layer 25.

A liquid crystal layer 3 may be disposed between the common electrode panel 200 and the thin film transistor array panel 100.

Hereinafter, the lower buffer layer 15 and the upper buffer layer 25 will be described in detail.

The lower buffer layer 15 and the upper buffer layer 25 may comprise parylene. For example, the lower buffer layer 15 and the upper buffer layer 25 may be formed by depositing parylene at room temperature by a chemical vapor deposition (CVD) method. In this case, parylene may be any one of parylene C, parylene D and parylene N. In some embodiments, only one of the lower buffer layer 15 and the upper buffer layer 25 may comprise parylene.

The lower buffer layer 15 and the upper buffer layer 25 may have a thickness of 100 Å to 1000 Å. In some cases, the lower buffer layer 15 and the upper buffer layer 25 may have a thickness of 100 Å to 500 Å. The lower buffer layer 15 and the upper buffer layer 25 may have dielectric constants of 2.0 to 2.5.

The lower alignment layer 11 and the upper alignment layer 21 may have dielectric constants of approximately 3.0. When the lower buffer layer 15 and the upper buffer layer 25 have smaller dielectric constants than the lower alignment layer 11 and the upper alignment layer 21, respectively, a driving voltage of the liquid crystal display does not significantly rise. The lower alignment layer 11 and the upper alignment layer 21 may be formed on the lower buffer layer 15 and the upper buffer layer 25 respectively by inkjet methods.

In addition, contact angles of the lower alignment layer 11 and the upper alignment layer 21 each may be 5 degrees or less to the lower buffer layer 15 and the upper buffer layer 25, respectively. The contact angle of the lower alignment layer 11 to the lower buffer layer 15, which is 5 degrees or less, helps the lower alignment layer 11 to uniformly spread on the lower buffer layer 15, such that the lower alignment layer 11 may be disposed on the contact hole 185 and the periphery thereof.

Hereinafter, the contact angles of the lower alignment layer 11 and the upper alignment layer 21 with respect to the lower buffer layer 15 and the upper buffer layer 25 will be described with reference to FIG. 3.

Figure 3:
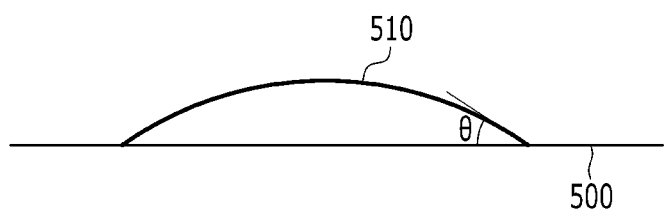
FIG. 3 is a schematic diagram illustrating a contact angle.

FIG. 3 is a schematic diagram illustrating a contact angle of a liquid droplet 510 to a reference plane 500. As shown in FIG. 3, a contact angle is defined as an angle θ between the liquid droplet 510 and the reference plane 500 when a liquid droplet 510 is dripping on a reference plane 500. In general, the smaller the contact angle is, the more uniformly the liquid droplet 510 spreads on the reference panel 500.

Next, the contact angle of the alignment layer to the buffer layer according to an exemplary embodiment of the present invention will be described with reference to FIG. 4.

Figure 4:
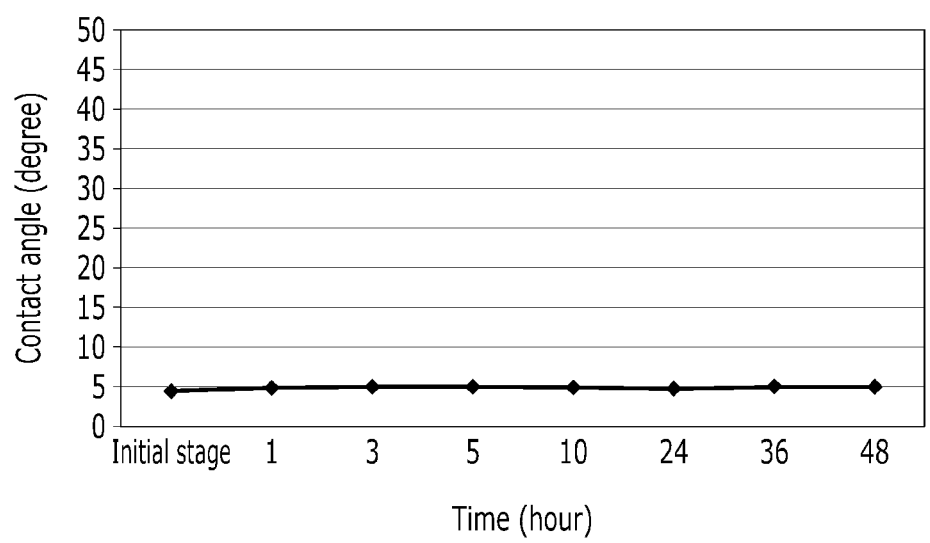
FIG. 4 is a graph showing a contact angle of an alignment layer to a buffer layer according to an exemplary embodiment of the present invention.

FIG. 4 is a graph showing a contact angle of an alignment layer to a buffer layer according to an exemplary embodiment of the present invention. As shown in FIG. 4, the contact angle of the alignment layer to the buffer layer is maintained at 5 degrees or less even until enough time has passed. It can be seen that the alignment layer is formed on the buffer layer to uniformly spread thereon.

In addition, gas permeability of the lower buffer layer 15 and the upper buffer layer 25 may be maintained low. Specifically, nitrogen gas ($N_2$) permeability, oxygen gas ($O_2$) permeability, carbon dioxide gas ($CO_2$) permeability, and hydrogen gas ($H_2$) permeability of the lower buffer layer 15 and the upper buffer layer 25 may be 0.6 or less, 5 or less, 14 or less, 110 or less, respectively. Moisture permeability of the lower buffer layer 15 and the upper buffer layer 25 may be 1 or less.

As such, since the nitrogen gas, oxygen gas, carbon dioxide gas, and hydrogen gas permeability of the upper buffer layer 25 is low, it is possible to reduce a residual gas forming at the color filters 230R, 230G, and 230B, which helps to reduce an amount of a residual gas that permeates the liquid crystal layer 3.

Hereinafter, a liquid crystal display according to another exemplary embodiment of the present invention will be described with reference to FIG. 5.

Figure 5:
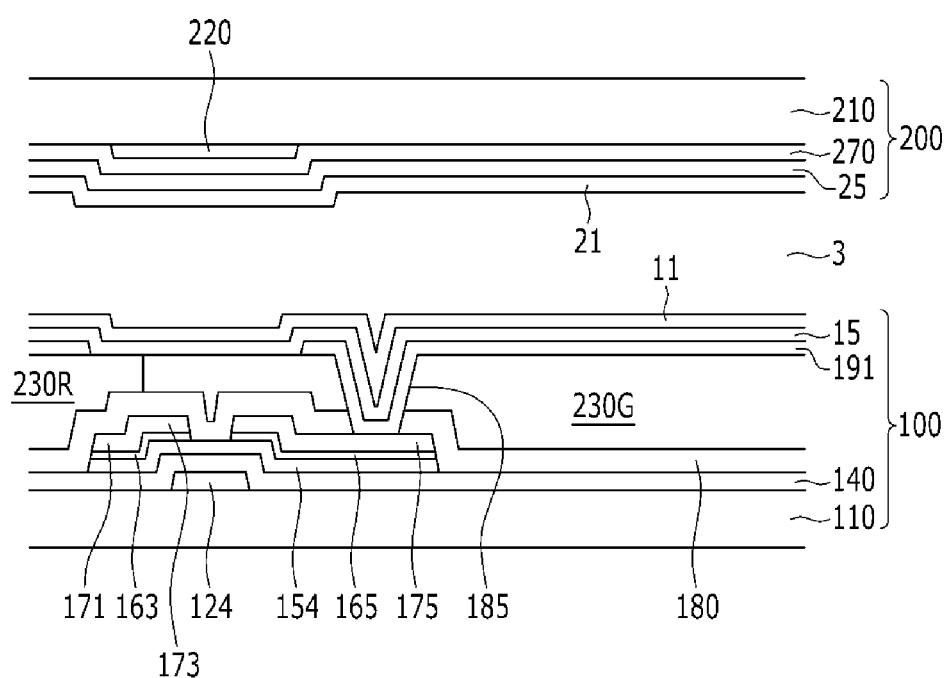
FIG. 5 is a cross-sectional view of a liquid crystal display according to another exemplary embodiment of the present invention.

FIG. 5 is a cross-sectional view of a liquid crystal display according to another exemplary embodiment of the present invention. In FIG. 5, in comparison with the liquid crystal display as shown in FIGS. 1 and 2, other structures are the same as each other except for the configuration in which color filters 230R, 230G, and 230B are formed on a thin film transistor array panel 100. Unless otherwise noted, description of various elements with reference to FIGS. 1 and 2 are also applicable to the same or similar elements in FIG. 5 to the extent that it is consistent with the description below.

First, the thin film transistor array panel 100 will be described.

A plurality of gate lines 121 may be disposed on a first substrate 110. A gate insulating layer 140, a plurality of semiconductor islands 154, a plurality of ohmic contacts 163 and 165, a plurality of data lines 171 and a plurality of drain electrodes 175 may be disposed on the first substrate 110 and the gate lines 121 in sequence.

The gate lines 121 each may include a plurality of gate electrodes 124 which protrude from the gate lines 121, and the data lines 171 each may include a plurality of source electrodes 173 which may extend toward the gate electrodes 124. The drain electrodes 175 may be separated from the data lines 171 and face the source electrodes 173 with respect to the gate electrodes 124.

A passivation layer 180 may be disposed on the gate insulating layer 140, the data lines 171 and the drain electrodes 175, and color filters 230R, 230G, and 230B may be disposed on the passivation layer 180.

A contact hole 185 may be provided in the passivation layer 180 and the color filters 230R, 230G, and 230B to expose the drain electrode 175.

A pixel electrode 191 may be disposed on the color filters 230R, 230G, and 230B and is connected to the drain electrode 175 through the contact hole 185.

A lower buffer layer 15 may be disposed on the pixel electrode 191, and a lower alignment layer 11 may be disposed on the lower buffer layer 15.

When a contact angle of the lower alignment layer 11 to the lower buffer layer 15 is 5 degrees or less, the lower alignment layer 11 may uniformly spread on the lower buffer layer 15, such that the lower alignment layer 11 may be disposed on the contact hole 185 and the periphery thereof.

In addition, a low gas permeability of the lower buffer layer 15 helps to reduce a residual gas forming at the color filters 230R, 230G, and 230B, which helps to reduce the residual gas that permeates the liquid crystal layer 3.

Hereinafter, a common electrode panel 200 will be described with reference to FIGS. 1 and 2.

A light blocking member 220 may be disposed on a second substrate 210, and a common electrode 270 may be disposed on the light blocking member 220.

An upper buffer layer 25 may be disposed on the common electrode 270, and an upper alignment layer 21 may be disposed on the upper buffer layer 25.

The liquid crystal layer 3 may be disposed between the common electrode panel 200 and the thin film transistor array panel 100.

It will be apparent to those skilled in the art that various modification and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
a first substrate;
a thin film transistor disposed on the first substrate;
a passivation layer disposed on the thin film transistor and comprising a contact hole exposing an electrode of the thin film transistor;
a pixel electrode disposed on the passivation layer and connected to the electrode of the thin film transistor through the contact hole;
a lower buffer layer disposed on the pixel electrode and in the contact hole;
a lower alignment layer disposed on the lower buffer layer and in the contact hole;
a second substrate facing the first substrate;
a common electrode disposed on the second substrate;
an upper buffer layer disposed on the common electrode; and
an upper alignment layer disposed on the upper buffer layer,
wherein the lower buffer layer comprises parylene, the upper buffer layer comprises parylene, or both the lower and the upper buffer layers comprise parylene.

2. The liquid crystal display of claim 1, wherein the parylene is any one of parylene C, parylene D and parylene N.

3. The liquid crystal display of claim 2, wherein dielectric constants of the lower buffer layer and the upper buffer layer are in a range of 2.0 to 2.5.

4. The liquid crystal display of claim 2, wherein thicknesses of the lower buffer layer and the upper buffer layer are each in a range of 100 Å to 1000 Å.

5. The liquid crystal display of claim 4, wherein the thicknesses of the lower buffer layer and the upper buffer layer are each in a range of 100 Å to 500 Å.

6. The liquid crystal display of claim 2, wherein both the lower buffer and the upper buffer layer comprise parylene, and contact angles of the lower alignment layer and the upper alignment layer to the lower buffer layer and the upper buffer layer, respectively, are 5 degrees or less.

7. The liquid crystal display of claim 2, wherein nitrogen gas ($N_2$) permeability, oxygen gas ($O_2$) permeability, carbon dioxide gas ($CO_2$) permeability, and hydrogen gas ($H_2$) permeability of the lower buffer layer and the upper buffer layer are each 0.6 or less, 5 or less, 14 or less, 110 or less, respectively.

8. The liquid crystal display of claim 7, wherein moisture permeability of the lower buffer layer and the upper buffer layer is 1 or less.

9. The liquid crystal display of claim 1, further comprising color filters disposed between the common electrode and the second substrate.

10. The liquid crystal display of claim 1, further comprising color filters disposed between the passivation layer and the pixel electrode.

11. The liquid crystal display of claim 1, wherein both the lower buffer layer and the upper buffer layer comprise parylene.

* * * * *